United States Patent [19]

Jwahashi et al.

[11] Patent Number: 4,725,915

[45] Date of Patent: Feb. 16, 1988

[54] SEMICONDUCTOR INTEGRATED CIRCUIT

[75] Inventors: Hiroshi Jwahashi, Yokohama; Masamichi Asano, Tokyo; Hiroshi Harada, Kawasaki; Shinichi Tanaka, Tokyo; Hideki Sumihara, Yokohama, all of Japan

[73] Assignee: Kabushiki Kaisha Toshiba, Kawasaki, Japan

[21] Appl. No.: 717,695

[22] Filed: Mar. 29, 1985

[30] Foreign Application Priority Data

Mar. 31, 1984 [JP] Japan ............................ 59-63583
Mar. 31, 1984 [JP] Japan ............................ 59-63584

[51] Int. Cl.⁴ .................. H01L 27/02; H01L 29/78; H03K 3/353
[52] U.S. Cl. ............................ 361/91; 357/43; 357/23.3; 357/23.8; 357/23.13; 357/23.14; 307/304; 361/56; 361/86
[58] Field of Search ............... 357/41, 43, 23.8, 23.14, 357/23.3, 23.13; 307/304; 361/56, 91, 86, 117, 118, 119

[56] References Cited

U.S. PATENT DOCUMENTS 3,518,454  6/1970  French ............................ 307/304
4,115,709  9/1978  Inoue et al. ...................... 307/304
4,342,045  7/1982  Kim ................................ 357/41
4,527,213  7/1985  Ariizumi .......................... 361/56

FOREIGN PATENT DOCUMENTS 034929   9/1981  European Pat. Off. ......... 357/23.13
2090701  7/1982  European Pat. Off. ......... 357/23.13
058557   8/1982  European Pat. Off. ......... 357/23.13
2005929  12/1969 France ............................ 357/23.13
0136278  10/1979 Japan ............................. 357/23.13

OTHER PUBLICATIONS

*I.E.E.E. Transactions on Electron Devices*, vol. Ed-29, No. 4, Apr. 1982, Fabrication of High . . . Technology, Paul J. Tsang et al.

*Primary Examiner*—Martin H. Edlow
*Assistant Examiner*—D. Featherstone
*Attorney, Agent, or Firm*—Finnegan, Henderson, Farabow, Garrett & Dunner

[57] ABSTRACT

A semiconductor integrated circuit includes a MOS transistor, and a transistor circuit in which one end of a current path is connected to a drain of this MOS transistor and which has an avalanche breakdown voltage lower than a breakdown voltage of the MOS transistor.

4 Claims, 11 Drawing Figures

F I G. 1
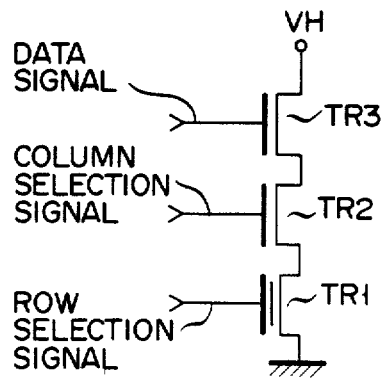
F I G. 2
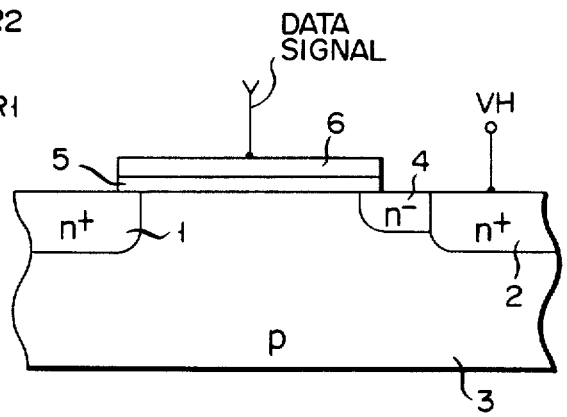
F I G. 3
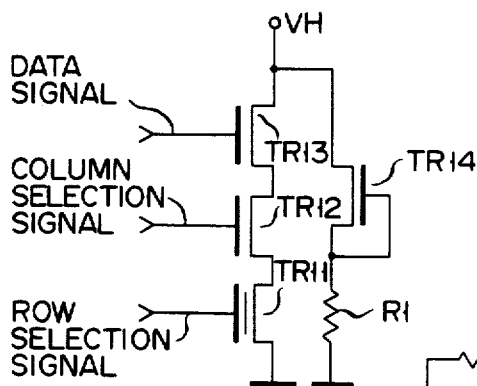
F I G. 4
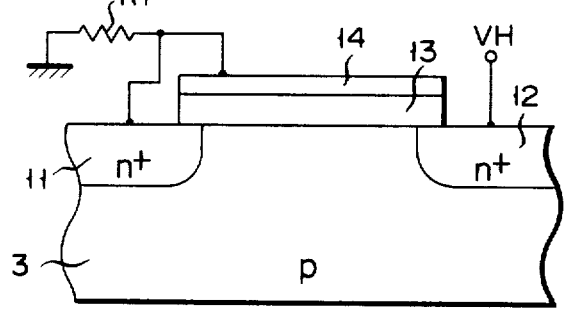

SEMICONDUCTOR INTEGRATED CIRCUIT

BACKGROUND OF THE INVENTION

The present invention relates to a semiconductor integrated circuit having as its function the prevention of the destruction of a MOS transistor.

Erasable/programmable read only memories (EPROM) require an operating voltage of, e.g., 5 V and a writing voltage of, e.g., 20 V, which is higher than the operating voltage in the data program mode or data writing mode. In order to get the higher drain avalanche breakdown voltage of a MOS transistor to which a voltage of 20 V is applied, various procedures are employed.

FIG. 1 schematically shows a memory circuit including a floating gate type MOS transistor TR1 which constitutes a memory cell. One end of a current path of the MOS transistor TR1 is grounded and the other end is connected to a high voltage terminal VH through MOS transistors TR2 and TR3 in series. Row and column selection signals from row and column decoders (not shown) are supplied to gates of the MOS transistors TR1 and TR2, while a data signal is supplied to a gate of the MOS transistor TR3 in the writing mode. When writing data, the row and column selection signals, with a voltage level of VH (20 V), are supplied to the gates of the MOS transistors TR1 and TR2, and the data signal at the VH level is supplied to the gate of the MOS transistor TR3. However, when no data is being written in the MOS transistor TR1, a signal of 0 V is supplied to the gate of the MOS transistor TR3, thereby making the MOS transistor TR3 non-conductive.

It is generally known that MOS transistors have a lower drain avalanche breakdown voltage due to the electric field between the drain and the gate when a gate voltage of 0 V is applied than when a turn-on voltage is applied to the gate. On one hand, as the elements become small, the gate insulation film becomes thin, so that the electric field between the drain and the gate becomes strong and thus causes the breakdown voltage to be lowered.

To prevent such a reduction in the breakdown voltage, as shown in FIG. 2, the impurity concentration of the portion of the drain close to the gate is made lower than that of the residual portion, thereby weakening the electric field between the gate and the drain.

In FIG. 2, n$^+$-type regions 1 and 2 are formed to face each other in the surface area of a p-type substrate 3. An n$^-$-type region 4 is formed so as to come into contact with the n$^+$-type region 2 and extend in the direction of the n$^+$-type region 1. A gate insulation film 5 is formed on the partial area of the p-type substrate 3 between the n$^+$-type region 1 and the n$^-$-type region 4. A gate electrode 6 is further formed on the gate insulation film 5. The n$^+$-type region 1 forms the source and the n$^+$-type region 2 and n$^-$-type region 4 cooperatively form the drain. A data signal is supplied to the gate electrode 6 and the n$^+$-type region 2 is connected to the high voltage terminal VH and the n$^+$-type region 1 is connected to, for example, a drain of the MOS transistor TR2.

In such an arrangement, when a high voltage is applied to the high voltage terminal VH, a wider depletion layer is formed between the n$^-$-type region 4 and the substrate 3, so that the electric field between the n$^-$-type region 4 and the gate electrode 6 becomes weak, thereby causing the breakdown voltage of this MOS transistor to be improved. However, if an abnormally high voltage is applied to the high voltage terminal VH due to the influence of static electricity or the like, a voltage higher than the dielectric breakdown voltage is applied to the gate insulation film 5 since the drain breakdown voltage is high, so that there is a possibility that this gate insulation film may be broken. This problem could easily occur as the elements become smaller and the gate insulation film becomes thinner.

Recently, a semiconductor integrated circuit having an output buffer circuit constructed by MOS transistors having similar structures as those shown in FIG. 2 has been provided. In operation, a voltage of 5 V is applied to drains of the MOS transistors of this output buffer circuit. However, when those drains are disconnected from a power source, an abnormally high voltage may be applied to the drains due to the influence of static electricity. In such a case, there is a possibility that the gate insulation films of the MOS transistors of the output buffer circuit will be broken as in the foregoing case.

SUMMARY OF THE INVENTION

It is an object of the present invention to provide a semiconductor integrated circuit designed to prevent a failure of a MOS transistor when a voltage over a predetermined value is applied to a drain of the MOS transistor.

According to one embodiment of the invention, there is provided a semiconductor integrated circuit comprising a MOS transistor and a transistor circuit in which one end of a current path is connected to a drain of the MOS transistor and wherein the transistor circuit has an avalanche breakdown voltage lower than the avalanche breakdown voltage of the MOS transistor.

In this invention, when a high voltage is applied to the drain of the MOS transistor, the transistor circuit is made conductive, thereby preventing this high voltage from being continuously applied to the drain of the MOS transistor.

BRIEF DESCRIPTION OF THE DRAWINGS

FIG. 1 shows a conventional memory circuit;

FIG. 2 is a schematic cross sectional view of a MOS transistor which is used in the memory circuit shown in FIG. 1 and whose conduction state is controlled in response to a data signal;

FIG. 3 shows a semiconductor integrated circuit according to one embodiment of the present invention;

FIG. 4 is a schematic cross sectional view of a MOS transistor which is used in the semiconductor integrated circuit shown in FIG. 3; which breaks down when a high voltage is applied to a high voltage terminal;

DETAILED DESCRIPTION OF THE PREFERRED EMBODIMENTS

Figure 5:
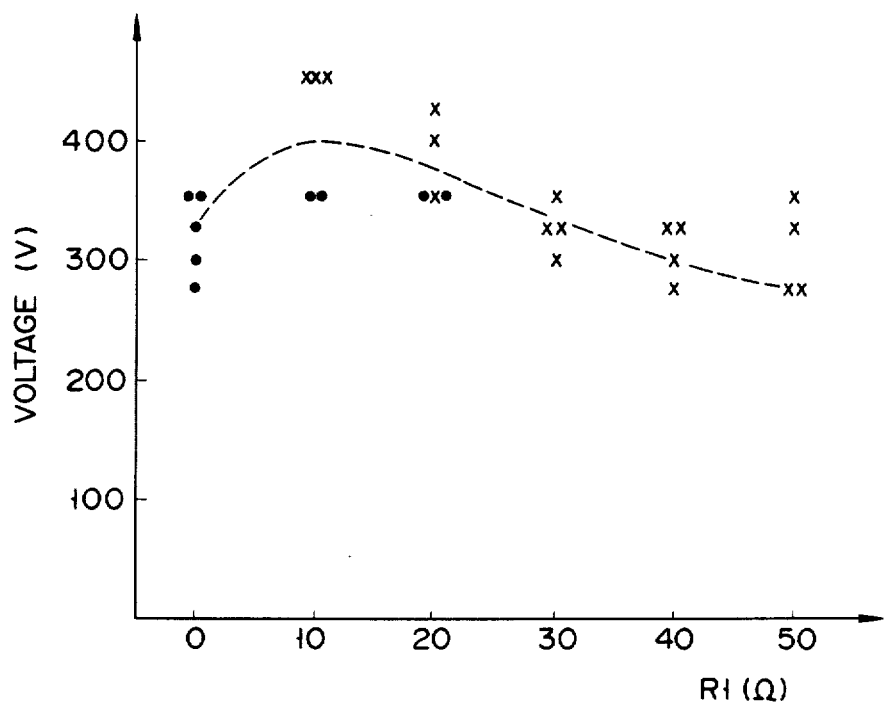
FIG. 5 shows actual measurement data showing the relation between a value of a resistor in the semiconductor integrated circuit shown in FIG. 3 and the voltage which had been applied to a high voltage terminal when at least one MOS transistor in the semiconductor integrated circuit was broken.

FIG. 3 shows a semiconductor integrated circuit according to one embodiment of the present invention. This semiconductor integrated circuit includes a floating gate type MOS transistor TR11 and MOS transistors TR12 and TR13 which are connected between the high voltage terminal VH and the ground terminal and are constructed similarly to the MOS transistors TR1 to TR3 shown in FIG. 1; and a MOS transistor TR14 whose drain is connected to the high voltage terminal VH and whose gate and source are grounded through a resistor R1. The MOS transistor TR13 is constructed similarly to the transistor structure shown in FIG. 2. As shown in FIG. 4, the MOS transistor TR14 is constituted by $n^+$-type regions 11 and 12 which are formed in the surface area of the p-type substrate 3 and serve as the source and drain, respectively; a gate insulation film 13 formed on the partial area of the p-type substrate 3 between the $n^+$-type regions 11 and 12; and a gate electrode 14 formed on the insulation film 13. The $n^+$-type region 11, which serves as the source, is electrically coupled to the gate electrode 14 and is also grounded through the resistor R1. The $n^+$-type region 12, which serves as the drain, is connected to the high voltage terminal VH. Further, the gate insulation film 13 of the MOS transistor TR14 shown in FIG. 4 is formed thicker than the gate insulation film 5 (FIG. 2) of the MOS transistor TR13.

If silicon gate technology issued to form the MOS transistor TR14 without increasing the number of manufacturing steps, it is convenient to form the MOS transistor TR14 by using a field oxide film as the gate insulation film on the partial area of the substrate between the $n^+$-type regions 11 and 12 and by forming an aluminum layer on this oxide film.

Since the gate insulation film 13 of the MOS transistor TR14 is thickly formed and the electric field between the gate and the drain is weak, in the case where the voltage at the high voltage terminal VH is gradually increased, a breakdown of the pn junction between the $n^+$-type region 12 near the field insulation film and the p-type substrate 3 occurs, before a breakdown of the $n^+$-type region 12 under the gate insulation film 13 occurs. A voltage VH1 at the high voltage terminal VH upon breakdown of the pn junction in the MOS transistor TR14 is set at a voltage level lower than a voltage VH2 which is applied to the high voltage terminal VH when the gate insulation film 5 of the MOS transistor TR13 is broken. In the MOS transistor TR14 shown in FIG. 4, it is assumed that the distance between the $n^+$-type regions 11 and 12 is, for instance, 4 μm and a breakdown of the pn junction between the $n^+$-type region 12 and the p-type substrate 3 occurs when a voltage of 26 V is applied to the high voltage terminal VH. Now, assume that a voltage over 26 V is applied to the high voltage terminal VH due to the influence of static electricity when the high voltage terminal VH is disconnected from a power source (not shown). Then, a breakdown of the pn junction occurs and the potential of the substrate 3 increases and the npn transistor of which the substrate 3 and the $n^+$-type regions 11 and 12 serve as the base, emitter and collector, respectively, is made conductive, causing the charges induced at the high voltage terminal VH, due to the static electricity, to be discharged through the $n^+$-type region 12, p-type substrate 3, $n^+$-type region 11, and resistor R1. Due to this, even if a high voltage is applied to the high voltage terminal VH, the MOS transistor TR11 will not be damaged.

According to the results of experiments by the inventors of the present invention, it has been found that as the channel width of the MOS transistor TR14 is large, the MOS transistor TR14 is not destroyed even if a higher voltage is applied to the high voltage terminal VH. In addition, in the case where the resistor R1 is set to zero ohm and a high voltage over a predetermined value is applied to the high voltage terminal VH due to the static electricity, it has been found from the experiment that the MOS transistor TR14 was damaged but the MOS transistor TR13 operated normally. In this case, it was considered that the charges induced due to the static electricity flowed through the MOS transistor TR14 and the MOS transistor TR14 was damaged due to heat generation or the like. Thus, the present inventors increased the value of the resistor R1 in order to suppress the current flowing through the MOS transistor TR14. For example, if the value of the resistor R1 was set to 50 ohms and a high voltage was applied to the high voltage terminal VH, the MOS transistor TR13 was damaged but the MOS transistor TR14 operated normally.

FIG. 5 shows the voltages applied to the high voltage terminal VH when the MOS transistors TR13 and TR14 were damaged when the value of the resistor R1 is set to 0, 10, 20, 30, 40, and 50 ohms ($\Omega$). After this high voltage was charged in a capacitor of 200 pF, this capacitor was connected to the high voltage terminal VH by use of a switch, thereby allowing this high voltage to be applied to the high voltage terminal VH. In the experiments, this high voltage was changed by 25 V at a time. In the diagram, a black dot ● indicates a voltage applied to the high voltage terminal VH when the MOS transistor TR14 of each sample was damaged, while a mark x represents a voltage applied to the high voltage terminal VH when the MOS transistor TR13 of each sample was damaged. As will be obviously understood from FIG. 5, when R1=0, five samples of MOS transistors TR14 were damaged when a voltage of about 250 to 350 V was applied to the high voltage terminal VH. On the other hand, when the resistor R1 is set to 10 $\Omega$, two samples of MOS transistors TR14 were damaged when VH is about 350 V and three samples of MOS transistors TR11 were damaged when VH is about 450 V.

According to the measurements taken by the present inventors, the voltages at which the MOS transistors TR13 and TR14 were damaged greatly increased when the resistor R1 was set to a value of 10 to 20 $\Omega$ in the case where: the breakdown voltage of the pn junction under the gate insulation film is 30 V when the gate voltage of the MOS transistor TR13 is 0 V; the thickness of the gate film is $5 \times 10^{-6}$ cm; the resistance of the substrate is 20 $\Omega$; the breakdown voltage of the pn junction near the field insulation film is 27 V; the thickness of the gate film of the MOS transistor TR14 is $12 \times 10^{-5}$ cm; and the channel width (W)/channel length (L) is 100 μm/4 μm.

Figure 6:
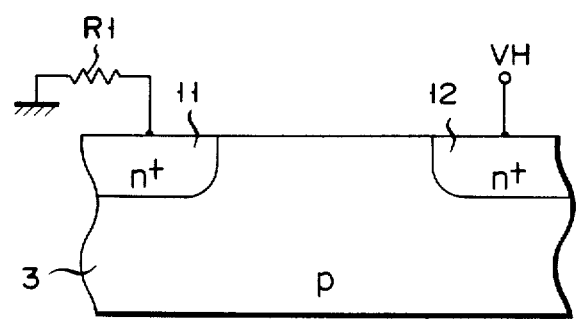
FIG. 6 shows an example of a modified form of the semiconductor device shown in FIG. 4.

FIG. 6 shows a semiconductor device which can be used in place of the MOS transistor TR14 shown in FIG. 4. This semiconductor device is constructed similarly to that shown in FIG. 4 except that the gate electrode 14 is removed. In this semiconductor device as well, the p-type substrate 3 and n+-type regions 11 and 12 form the base, emitter and collector of a bipolar transistor, respectively.

Figure 7:
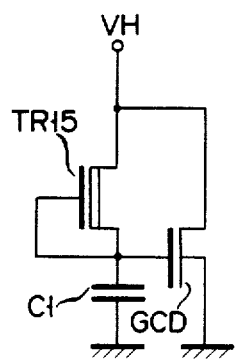
FIG. 7 shows a part of a semiconductor integrated circuit according to another embodiment of the invention.
Figure 8:
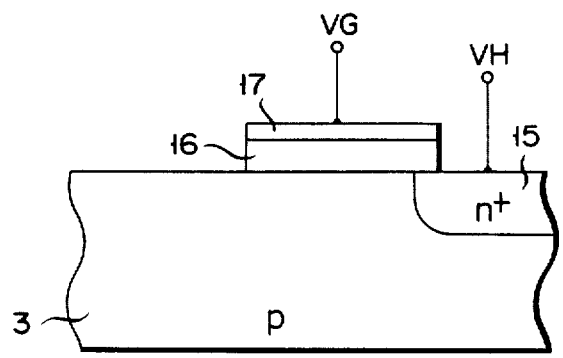
FIG. 8 is a schematic cross sectional view of a gate controlled diode which is used in the semiconductor circuit shown in FIG. 7.

FIG. 7 shows a semiconductor circuit which is used in place of the MOS transistor TR14 and resistor R1 shown in FIG. 3. This semiconductor circuit includes a depletion type (D-type) MOS transistor TR15 which is grounded through a capacitor C1 and in which one end of a current path is connected to the high voltage terminal VH and the other end is connected to a gate thereof; and a gate controlled diode GCD whose gate is connected to the junction between the MOS transistor TR15 and the capacitor C1. As shown in FIG. 8, the gate controlled diode GCD is constituted by an n+-type region 15 formed in the surface area of the p-type substrate 3; a gate insulation film 16 formed on a portion of the p-type substrate 3 and on a portion of the n+-type region 15; and a gate electrode 17 formed on the gate insulation film 16. This gate electrode 17 is connected to a gate terminal VG which is coupled with the junction between the MOS transistor TR15 and the capacitor C1. The n+-type region 15 is connected to the high voltage terminal VH. The substrate 3 is grounded.

Figure 9:
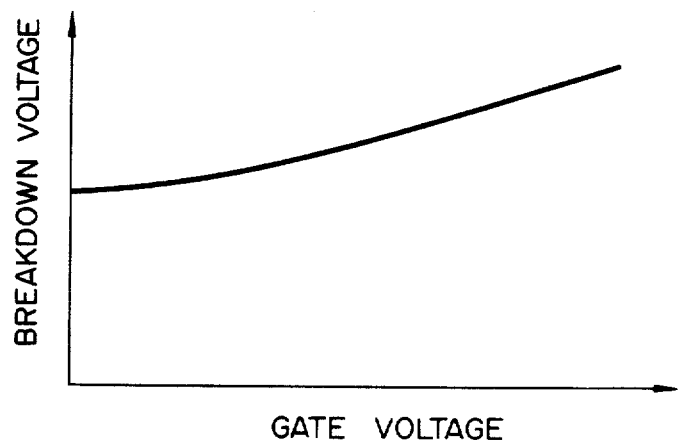
FIG. 9 shows a graph representing the relation between a gate voltage and a breakdown voltage in the semiconductor device shown in FIG. 8.

In the gate controlled diode GCD having a structure as shown in FIG. 8, the relation between the gate voltage VG and the avalanche breakdown voltage applied to the high voltage terminal VH when a breakdown of the diode GCD occurred is as shown in FIG. 9. As will be apparent from FIG. 9, when the gate voltage VG is 0 V, the breakdown voltage is at its lowest point. In the embodiment, this gate voltage—breakdown voltage characteristic is used. Practically speaking, when the high voltage terminal VH is disconnected from the power source, the gate voltage VG is set at 0 V to cause a breakdown of the diode GCD at a low breakdown voltage, thereby preventing the MOS transistor TR13 from being damaged, as shown in FIG. 3. On the other hand, when the voltage VH (e.g., 20 V) is normally applied to the high voltage terminal VH, the gate voltage VG is set at the VH level and the breakdown voltage of the diode GCD is raised, thereby preventing the MOS transistor TR13 and diode GCD from being broken.

In the circuit shown in FIG. 7, when the program voltage of 20 V is applied to the high voltage terminal VH, a voltage of about 20 V is applied to the gate of the diode GCD through the MOS transistor TR15, so that the breakdown voltage of the diode GCD increases. Thus, even if a voltage of over 20 V, for example, is applied to the high voltage terminal VH, a breakdown of the diode GCD does not occur. However, if a surge voltage is applied to this high voltage terminal due to the influence of the static electricity when the high voltage terminal is disconnected from the power source, this surge voltage is immediately applied to one end of the diode GCD. However, the gate voltage VG slowly increases due to a time constant which is determined by the MOS transistor TR15 and capacitor C1, so that a breakdown of the diode GCD occurs at a voltage lower than the breakdown voltage of the MOS transistor TR13. Thus, the charges produced by the static electricity are discharged rapidly through this diode GCD, in which the breakdown occurred, thereby preventing the MOS transistor TR13 from being damaged due to the high voltage which is applied to the high voltage terminal VH and steeply rises.

Figure 10:
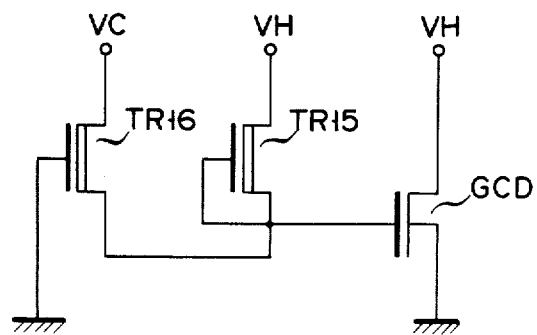
FIG. 10 shows a modified form of the semiconductor integrated circuit shown in FIG. 7.

FIG. 10 is a modified form of the semiconductor integrated circuit shown in FIG. 7. This semiconductor integrated circuit is constructed similarly to that shown in FIG. 7 except that in place of the capacitor C1, a D-type MOS transistor TR16 whose current path is connected between a power source terminal VC adapted to receive the operating voltage of, e.g., 5 V and the MOS transistor TR15, and whose gate is grounded is used.

In ordinary operation, a voltage of, e.g., 5 V is applied to the power source terminal VC and a voltage of 20 V is applied to the high voltage terminal VH. The gate voltage of the MOS transistor TR16 is 0 V and a voltage of 5 V is applied to its source, so that the MOS transistor TR16 is kept non-conductive. Therefore, a voltage of 20 V is applied to the gate of the gate controlled diode GCD through the D-type MOS transistor TR15, causing the breakdown voltage of the diode GCD to be greatly increased. On the other hand, when the high voltage terminal VH and the power source terminal VC are disconnected from the power source, as is the case when this semiconductor integrated circuit is hand-carried or the like, a voltage which steeply increases may be applied to the high voltage terminal VH due to static electricity or the like. When such a rapidly increasing high voltage is applied to the high voltage terminal VH, the voltage divided by the MOS transistors TR15 and TR16 is applied to the gate of the diode GCD. In this case, the drain voltage of the MOS transistor TR16 is set at a low level. Therefore, a high voltage is applied to the diode GCD in a state that a low voltage was applied to its gate, so that this easily causes a breakdown of the diode GCD. Thus, the charges produced due to the static electricity are discharged to the ground through the diode GCD, thereby reducing the potential at the high voltage terminal VH and preventing the MOS transistor TR13 from being broken.

Figure 11:
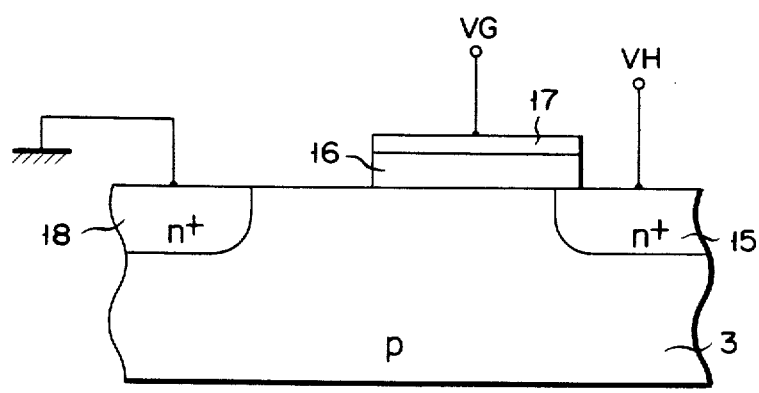
FIG. 11 shows a modified form of the semiconductor device shown in FIG. 8.

FIG. 11 shows a semiconductor device which is constructed similarly to that shown in FIG. 8 except that the device of FIG. 11 is provided with an n+-type region 18 formed in the surface area of the p-type substrate 3 at the location apart from the gate insulation layer 16 so as to face the n+-type region 15.

In the case of using the gate controlled diode GCD constituted in this way, when an avalanche breakdown of the diode GCD occurs, the potential of the substrate 3 increases and the n+-type regions 15 and 18 and p-type substrate 3 may function as the collector, emitter and base of a bipolar transistor, respectively. Due to this, a large quantity of charges produced at the high voltage terminal VH are discharged to the ground through the n+-type region 15, p-type substrate 3 and n+-type region 18, thereby rapidly lowering the potential at the high voltage terminal VH.

Although the present invention has been described above with respect to the illustrated embodiments, the invention is not limited to only those embodiments. For example, in the foregoing embodiments, the case where a high voltage is applied to the high voltage terminal VH due to the static electricity has been described. However, the invention can be also applied to a semiconductor integrated circuit without such a high voltage terminal VH. Namely, even in the MOS transistor having the structure shown in FIG. 2, in which the operation voltage of 5 V instead of the high voltage of 20 V is supplied to the drain, there is a case where when this drain is disconnected from the power source, an abnormally high voltage is applied to this drain due to the static electricity. However, in this case also, the use of the protecting circuits as shown in FIGS. 3, 7 and 10 makes it possible to prevent a similar breakdown of the MOS transistor in the manner as described above.

In addition, in the circuit shown in FIG. 7, the capacitor C1 may be omitted in the case where the parasitic capacitance between the gate of the gate controlled diode GCD and the ground is large.

What is claimed is:

1. A semiconductor integrated circuit comprising: first and second potential terminals;
   a first MOS transistor coupled between said first and second potential terminals;
   a gate-controlled diode having a gate, being connected to a drain of said first MOS transistor, and having a breakdown voltage controlled by a gate voltage applied to said gate; and
   a depletion type MOS transistor coupled to a mode between the gate of said gate-controlled diode and the drain of said first MOS transistor, wherein said gate-controlled diode is constituted by a substrate of one conductivity type; a first semiconductor region of an opposite conductivity type formed in the surface area of said substrate; and gate insulation layer formed on the substrate, with part of said gate insulation layer formed on a portion of said first semiconductor region; a gate electrode formed on said gate insulation layer; and
   a second semiconductor region of the opposite conductivity type formed in the surface area of said substrate, at a location apart from said gate insulation layer, to face said first semiconduction region.

2. A semiconductor integrated circuit according to claim 1, further including capacitive means coupled between said depletion type MOS transistor and said second potential terminal.

3. A semiconductor integrated circuit according to claim 1, wherein said first MOS transistor comprises: a substrate of one conductivity type; drain and source regions of an opposite conductivity type formed in the surface area of said substrate, said drain region including a first region and a second region having an impurity concentration lower than that of said first region; a gate insulation film formed on the partial area of said substrate between said source region and said second region of said drain region; and a gate electrode formed on said gate insulation film.

4. A semiconductor integrated circuit according to claim 1, further including a second depletion type MOS transistor connected to provide a current path between said first depletion type MOS transistor and a power source terminal and having a gate connected to said second potential terminal.

* * * * *

UNITED STATES PATENT AND TRADEMARK OFFICE
CERTIFICATE OF CORRECTION

PATENT NO.   : 4,725,915

DATED        : February 16, 1988

INVENTOR(S)  : Iwahashi et al

It is certified that error appears in the above-identified patent and that said Letters Patent is hereby corrected as shown below:

On the title page, Items (19) and (75) "Hiroshi Jwahashi" should read -- Hiroshi Iwahashi --.

Signed and Sealed this

Twenty-seventh Day of September, 1988

*Attest:*

DONALD J. QUIGG

*Attesting Officer*  *Commissioner of Patents and Trademarks*